(12) United States Patent
Lee et al.

(10) Patent No.: US 12,495,689 B2
(45) Date of Patent: *Dec. 9, 2025

(54) FLEXIBLE DISPLAY DEVICE

(71) Applicant: LG Display Co., Ltd., Seoul (KR)

(72) Inventors: Saemleenuri Lee, Seoul (KR); SeYeoul Kwon, Goyang-si (KR); Dojin Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/639,455

(22) Filed: Apr. 18, 2024

(65) Prior Publication Data

US 2024/0268213 A1 Aug. 8, 2024

Related U.S. Application Data

(63) Continuation of application No. 17/741,923, filed on May 11, 2022, now Pat. No. 11,991,918, which is a
(Continued)

(30) Foreign Application Priority Data

Dec. 15, 2015 (KR) .................... 10-2015-0178916

(51) Int. Cl.
*H10K 59/131* (2023.01)
*H10D 30/67* (2025.01)
(Continued)

(52) U.S. Cl.
CPC ....... *H10K 59/131* (2023.02); *H10D 30/6723* (2025.01); *H10D 30/6758* (2025.01);
(Continued)

(58) Field of Classification Search
CPC .. H10K 59/131; H10K 77/111; H10D 86/441; H10D 86/60; H10D 30/6723; H10D 30/6758; H10D 86/411; H01L 51/0097
See application file for complete search history.

(56) References Cited

U.S. PATENT DOCUMENTS 9,082,667 B2    7/2015   Youn et al.
9,293,485 B2    3/2016   Youn et al.
(Continued)

FOREIGN PATENT DOCUMENTS

CN   104103669 A   10/2014
CN   104183600 A   12/2014
(Continued)

OTHER PUBLICATIONS

China National Intellectual Property Administration, First Notification of Office Action, CN Patent Application No. 201610380459.8, Sep. 24, 2019, 20 pages.
(Continued)

*Primary Examiner* — Suberr L Chi
(74) *Attorney, Agent, or Firm* — Fenwick & West LLP

(57) ABSTRACT

A flexible display device of which esthetic appearance is improved by reducing a bezel is disclosed. The flexible display device comprises a substrate including a display area and a non-display area including a bending area; a link line in the non-display area on the substrate; and a bending connection line in the bending area pf the substrate and connected with the link line, and the bending connection line located between a first buffer layer and a second buffer layer of the flexible display device.

16 Claims, 9 Drawing Sheets

Related U.S. Application Data continuation of application No. 16/943,505, filed on Jul. 30, 2020, now Pat. No. 11,362,292, which is a continuation of application No. 16/254,275, filed on Jan. 22, 2019, now Pat. No. 10,847,545, which is a continuation of application No. 15/147,498, filed on May 5, 2016, now Pat. No. 10,224,344.

(51) Int. Cl.

| | | |
|---|---|---|
| *H10D 86/40* | (2025.01) | |
| *H10D 86/60* | (2025.01) | |
| *H10K 77/10* | (2023.01) | |
| *H10K 59/121* | (2023.01) | |
| *H10K 59/126* | (2023.01) | |
| *H10K 102/00* | (2023.01) | |

(52) U.S. Cl.
CPC ......... *H10D 86/411* (2025.01); *H10D 86/441* (2025.01); *H10D 86/60* (2025.01); *H10K 77/111* (2023.02); *H10K 59/1213* (2023.02); *H10K 59/126* (2023.02); *H10K 2102/311* (2023.02); *Y02E 10/549* (2013.01)

(56) References Cited

U.S. PATENT DOCUMENTS

| | | | |
|---|---|---|---|
| 9,318,427 B2 | 4/2016 | Youn et al. | |
| 9,472,507 B2 | 10/2016 | Kwak | |
| 9,647,052 B2 | 5/2017 | Youn et al. | |
| 9,659,966 B2 | 5/2017 | Kwak et al. | |
| 9,760,125 B2 | 9/2017 | Kim et al. | |
| 10,847,545 B2 * | 11/2020 | Lee | H10D 30/6723 |
| 11,991,918 B2 * | 5/2024 | Lee | H10D 86/411 |
| 2003/0027369 A1 | 2/2003 | Yamazaki | |
| 2004/0126945 A1 | 7/2004 | Shibata et al. | |
| 2006/0273304 A1 | 12/2006 | Cok | |
| 2010/0213819 A1 | 8/2010 | Cok et al. | |
| 2014/0002385 A1 | 1/2014 | Ka et al. | |
| 2014/0042406 A1 | 2/2014 | Degner et al. | |
| 2014/0217373 A1 | 8/2014 | Youn et al. | |
| 2014/0217397 A1 | 8/2014 | Kwak et al. | |
| 2014/0232956 A1 | 8/2014 | Kwon et al. | |
| 2014/0299884 A1 | 10/2014 | Park et al. | |
| 2014/0306941 A1 | 10/2014 | Kim et al. | |
| 2014/0353670 A1 | 12/2014 | Youn et al. | |
| 2014/0354558 A1 | 12/2014 | Cho et al. | |
| 2014/0367658 A1 | 12/2014 | Kwak | |
| 2015/0287750 A1 | 10/2015 | Youn et al. | |
| 2016/0035812 A1 | 2/2016 | Kwon et al. | |
| 2016/0079336 A1 | 3/2016 | Youn et al. | |
| 2016/0218305 A1 | 7/2016 | Kim et al. | |
| 2016/0322451 A1 | 11/2016 | Park | |
| 2017/0012063 A1 | 1/2017 | Kwak | |
| 2018/0090520 A1 | 3/2018 | Kwak | |

FOREIGN PATENT DOCUMENTS

| | | |
|---|---|---|
| CN | 104241544 A | 12/2014 |
| CN | 105074802 A | 11/2015 |
| CN | 105144270 A | 12/2015 |
| CN | 105144418 A | 12/2015 |
| JP | 2012-518892 A | 8/2012 |
| JP | 2013-178525 A | 9/2013 |
| JP | 2014-232300 A | 12/2014 |
| KR | 10-2014-0099139 A | 8/2014 |
| KR | 10-2014-0141380 A | 12/2014 |
| WO | WO 2014/126403 | 8/2014 |

OTHER PUBLICATIONS

Extended European Search Report for European Patent Application No. EP 16201802.2, May 15, 2017, 10 Pages.
Korean Intellectual Property Administration, Office Action, KR Patent Application No. 10-2015-0178916, Feb. 28, 2023, ten pages.
Office Action for Japanese Patent Application No. JP 2016-227525, Sep. 13, 2017, 7 Pages.
United States Office Action, U.S. Appl. No. 15/147,498, filed Mar. 21, 2018, 14 pages.
United States Office Action, U.S. Appl. No. 15/147,498, filed Sep. 8, 2017, nine pages.
United States Office Action, U.S. Appl. No. 15/147,498, filed Mar. 13, 2017, ten pages.
United States Office Action, U.S. Appl. No. 16/254,275, filed Jan. 2, 2020, ten pages.
United States Office Action, U.S. Appl. No. 16/943,505, filed Dec. 14, 2021, 14 pages.
United States Office Action, U.S. Appl. No. 17/741,923, filed Oct. 5, 2023, 12 pages.

* cited by examiner

FLEXIBLE DISPLAY DEVICE

CROSS REFERENCE TO RELATED APPLICATIONS

This application is a continuation of U.S. patent application Ser. No. 17/741,923 filed on May 11, 2022, which is a continuation of U.S. patent application Ser. No. 16/943,505 filed on Jul. 30, 2020 which is a continuation of U.S. patent application Ser. No. 16/254,275 filed on Jan. 22, 2019 which is a continuation of U.S. patent application Ser. No. 15/147,498 filed on May 5, 2016 which claims the benefit of Korean Patent Application No. 10-2015-0178916 filed on Dec. 15, 2015, each of which is incorporated by reference in its entirety.

BACKGROUND

Field of Technology

The present disclosure relates to a flexible display device.

Discussion of the Related Art

Recently, with the advancement of the information age, display devices for processing and displaying a large amount of information have been rapidly developed. In response to this trend, various display devices have been introduced and spotlighted. Detailed examples of the display devices include liquid crystal display (LCD) devices, plasma display panel (PDP) devices, field emission display (FED) devices, electroluminescence display (ELD) devices, and organic light emitting display (OLED) devices.

Among the display devices, the organic light emitting display device based on an organic light emitting diode has advantages in that the organic light emitting diode provided in a display panel has high luminance and low operation voltage property. Also, since the organic light emitting display device is a self-light emitting device that has a good contrast ratio, it is advantageous in that the organic light emitting display device realizes an ultra-thin display. Also, the organic light emitting display device has a response time of several microseconds to easily display moving images, has no limitation in a viewing angle, and is stable even at a low temperature.

Recently, efforts for realizing a flat panel display device as a flexible display device to realize various objects such as easy portability, various types and damage avoidance have been made. For example, a liquid crystal display device and an organic light emitting display device are arranged on a flexible substrate such as plastic, whereby a flexible liquid crystal display device and a flexible organic light emitting display device can be manufactured.

However, to have a bending property of the flexible display device, development of a bending property of inner elements of the display device in addition to the flexible substrate has been required.

Also, in accordance with the application of a flexible property to the display device, a bezel bending technique has been introduced, which minimizes a bezel width by bending an area corresponding to a bezel portion where image is not displayed.

FIG. 1 is a plane view illustrating a conventional flexible display device based on bezel bending, FIG. 2 is an enlarged view illustrating an area A of FIG. 1, FIG. 3 is a cross-sectional view taken along line I-I' shown in FIG. 1, and FIG. 4 is a cross-sectional view illustrating that a bending area of FIG. 3 is bent.

Referring to FIGS. 1 to 4, the conventional flexible display device based on bezel bending includes a display area 1, a non-display area 2, a bending area 3, a gate-in-panel (GIP) area 4, and a driving portion 5.

The display area 1 is an area where an image is displayed, and the non-display area 2 is an area where an image is not displayed. A part of the non-display area 2 includes the bending area 3 of a bent type. The GIP area 4 is an area where a gate driving circuit is arranged inside a display panel where a thin-film transistor (TFT) substrate is formed.

The display area 1 and the non-display area 2 include a substrate 25, a polyimide layer 24, a multi-barrier layer 23, an inorganic layer 22, a gate insulating layer 12, a dielectric inter-layer 21, and a passivation layer 20.

In this case, a thin film transistor layer T, a planarization layer 30, an anode electrode 40 and an auxiliary electrode 50 are formed on the display area 1. The thin film transistor layer T includes an active layer 11, a gate insulating film 12, a gate electrode 13, a dielectric inter-layer 14, a source electrode 15, and a drain electrode 16.

A bank 60 is formed on the anode electrode 40 and the auxiliary electrode 50 to define a pixel area, an organic light emitting layer 70 is formed in the pixel area defined by the bank 60, and a cathode electrode 80 is formed on the organic light emitting layer 70.

In the aforementioned conventional flexible display device, as shown in FIG. 4, the bending area 4 is bent to minimize a bezel corresponding to a part of the non-display area 2. At this time, a crack may occur in a source electrode 15 connected from the thin film transistor layer T. Therefore, the conventional flexible display device uses a line having the same shape as a pattern of FIG. 2 to reduce such a crack.

However, in this case, the source electrode 15 is not disposed on a neutral plane, whereby the crack occurring in the source electrode 15 is not avoided fully.

Also, in this case, a problem occurs in that it is impossible to apply the line of FIG. 2 to a high resolution display device due to a distance P between lines and a width L of the lines as shown in FIG. 2. This is because there is restriction in design of the line due to an area reserved by the distance P and width L of the lines relatively increased in the high resolution display device.

SUMMARY

Accordingly, the present disclosure is directed to a flexible display device that substantially obviates one or more problems due to limitations and disadvantages of the related art.

An advantage of the present disclosure is to provide a flexible display device that can prevent a crack from occurring in lines of a bending area.

Another advantage of the present disclosure is to provide a flexible display device of high resolution by using a straight line.

Other advantage of the present disclosure is to provide a flexible display device of which esthetic appearance is improved by minimizing a bezel of a non-display area.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in one embodiment a flexible display device comprises a substrate including a display area that displays images and a non-display area where images are not displayed, the non-display area including a bending area where the flexible display device is capable of being bent; a link line in the non-display area on the substrate; a first buffer layer in the bending area on the substrate; a bending connection line on the first buffer layer in the bending area on the substrate, the bending connection line connected with the link line in the bending area; and a second buffer layer on the bending connection line in the bending area of the substrate.

In another embodiment, a flexible display device comprises a substrate including a display area that displays images and a non-display area where images are not displayed, the non-display area including a bending area where the flexible display device is capable of being bent; a thin-film-transistor (TFT) in the display area, the TFT including an electrode located in a first layer of the flexible display device; a bending connection line in the bending area of the non-display area, the bending connection line located in a second layer of the flexible display device that is beneath the first layer that includes the electrode of the TFT; a link line in the non-display area that electrically connects together the electrode of the TFT in the first layer and the bending connection line located in the second layer via at least one contact hole; and a first buffer layer and a second buffer layer, the bending connection line between the first buffer layer and the second buffer layer in the bending area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
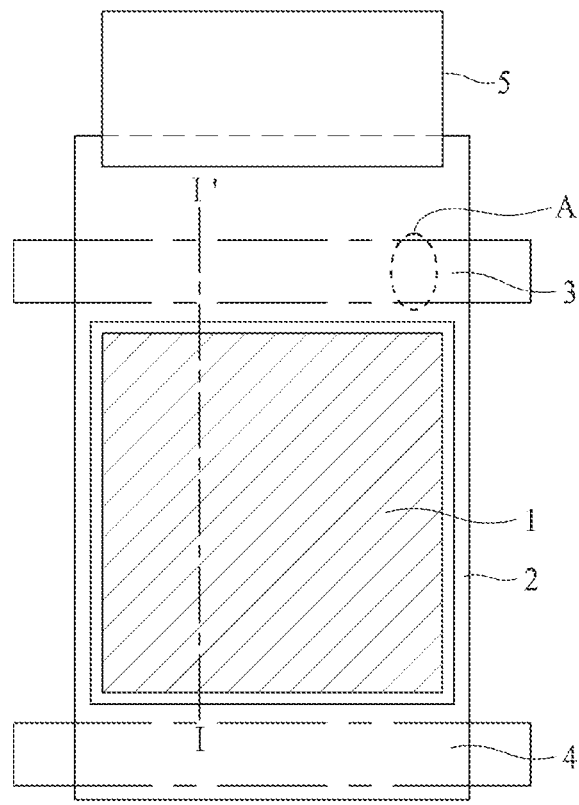
FIG. 1 is a front view illustrating a conventional flexible display device.
Figure 2:
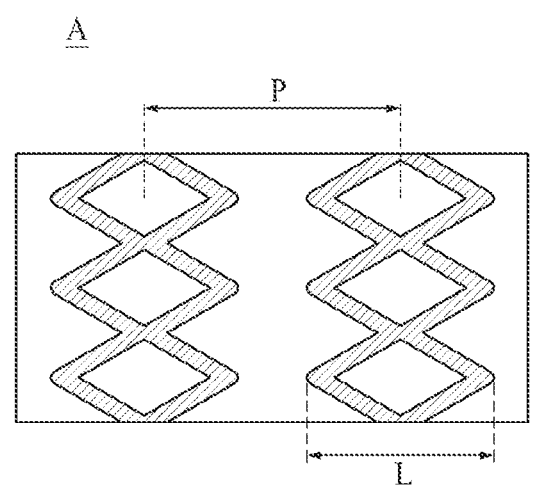
FIG. 2 is an enlarged view illustrating an area A of FIG. 1.
Figure 3:
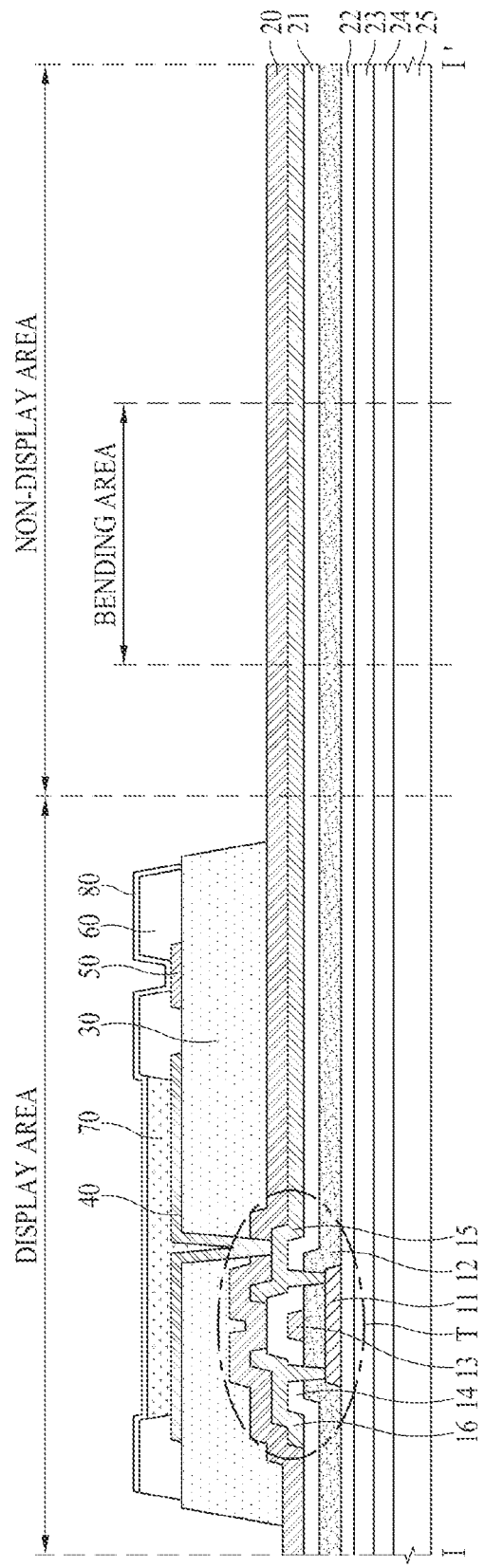
FIG. 3 is a cross-sectional view taken along line I-I' shown in FIG. 1.
Figure 4:
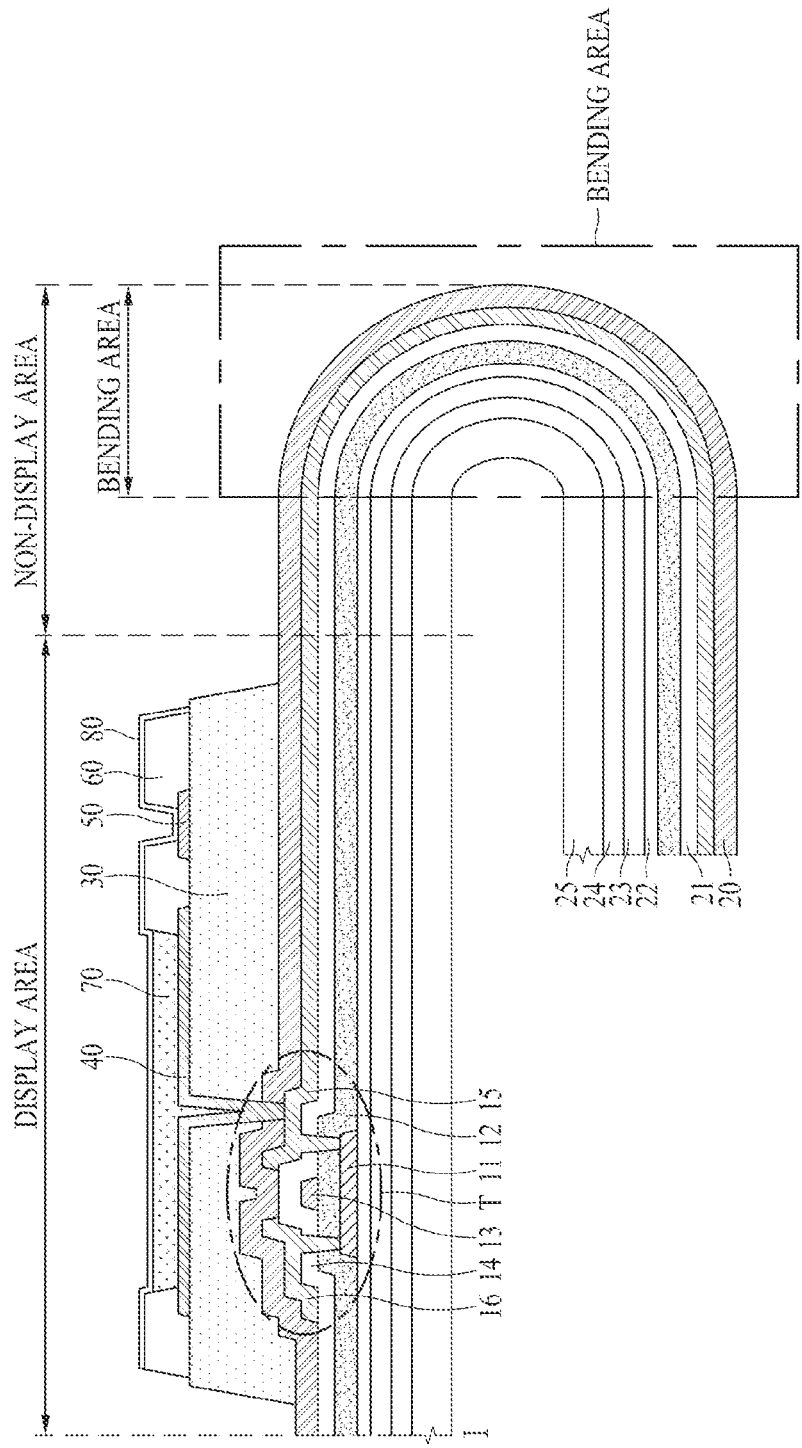
FIG. 4 is a cross-sectional view illustrating that a conventional flexible display device is bent.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present disclosure, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed there between.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclsoure will be described in detail with reference to the accompanying drawings.

Figure 5:
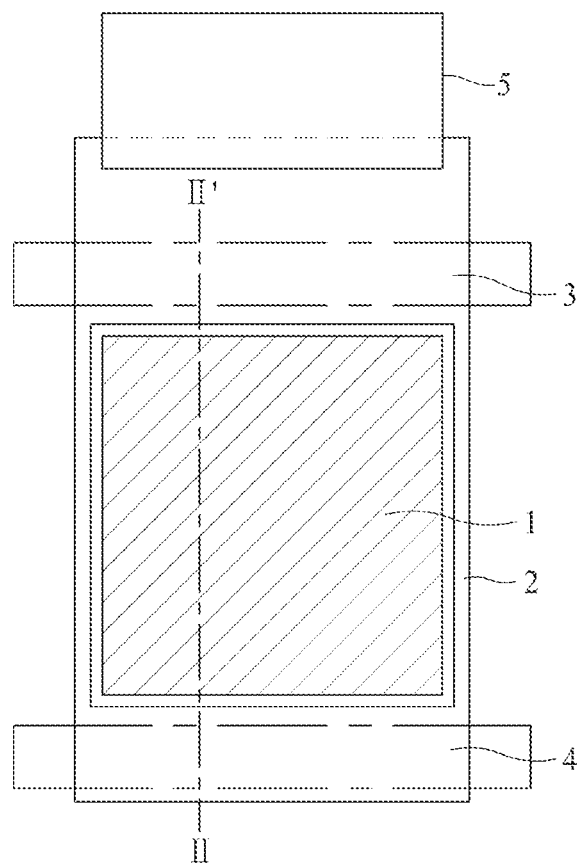
FIG. 5 is a front view illustrating that a flexible display device according to the present disclosure.
Figure 6:
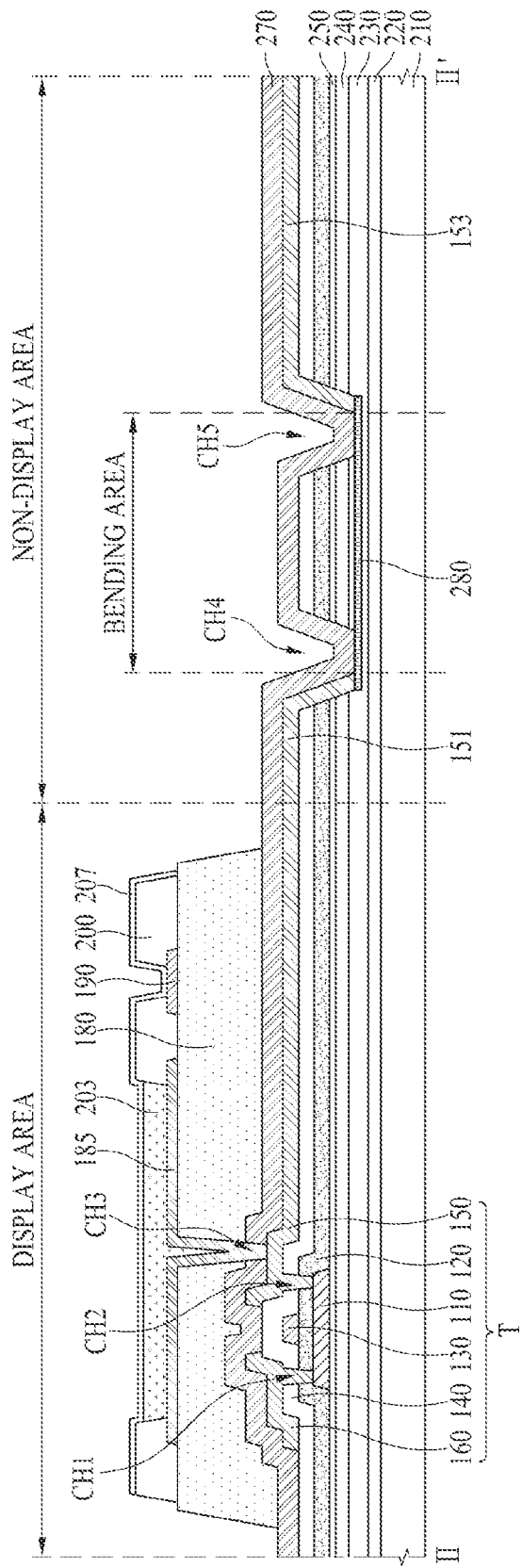
FIG. 6 is a cross-sectional view taken along line II-II' shown in FIG. 5 according to one embodiment of the present disclosure.

FIG. 5 is a front view illustrating that a flexible display device according to the present invention, and FIG. 6 is a cross-sectional view taken along line II-II' shown in FIG. 5.

Figure 7:
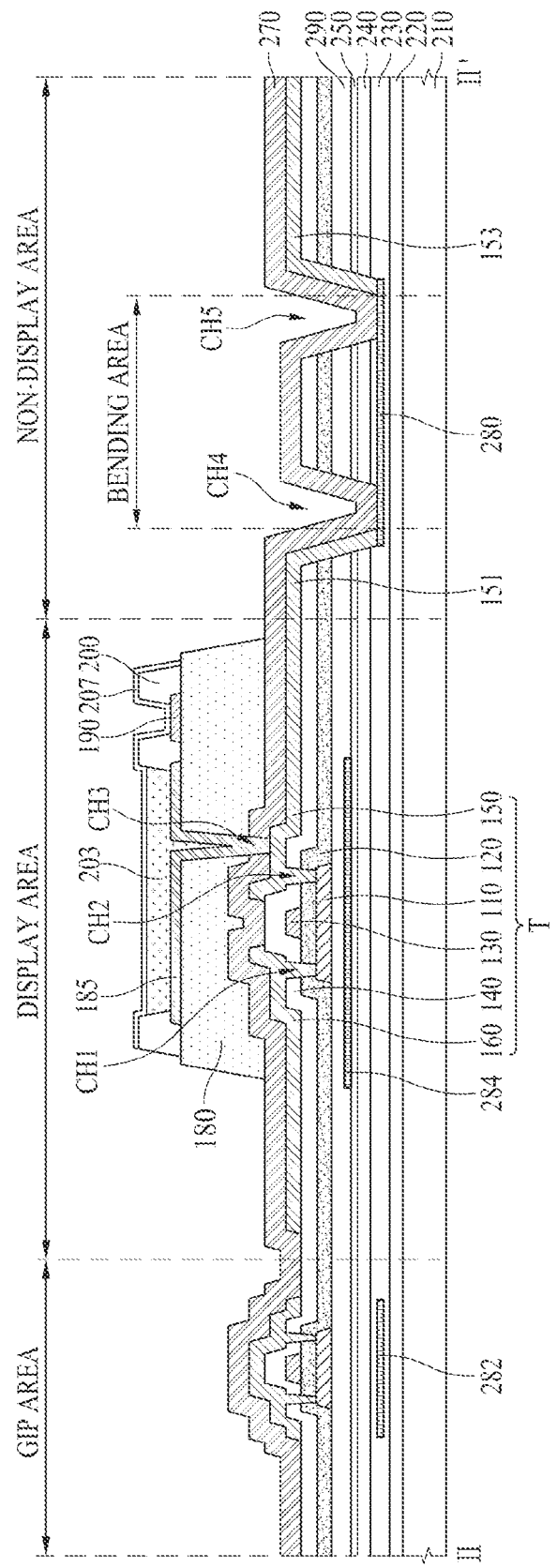
FIG. 7 is a cross-sectional view taken along line II-II' shown in FIG. 5 according to another embodiment of the present disclosure.

Referring to FIGS. 5, 6 and 7, the flexible display device according to the present disclosure includes a display area 1, a non-display area 2, a driving film 5, and a GIP area 4. The non-display area 2 includes a bending area 3. First of all, the display area 1 will be described, which will be followed by the non-display area 2 and the bending area 3.

The display area 1 includes a first buffer layer 220 on a substrate 210, an inorganic layer 230, a second buffer layer 240, a multi-buffer layer 250, a thin film transistor T, a passivation layer 270, a planarization layer 180, an anode electrode 185, an auxiliary electrode 190, a bank layer 200, an organic light emitting layer 203, and a cathode electrode 207.

The substrate 210 may be a plastic film. For example, the substrate 210 may be, but not limited to, a sheet or film that includes cellulose resin such as TAC (triacetyl cellulose) or DAC (diacetyl cellulose), COP (cyclo olefin polymer) such as Norbornene derivatives, COC (cyclo olefin copolymer), acrylic resin such as PMMA (polymethylmethacrylate), polyolefin such as PC (polycarbonate), PE (polyethylene) or PP (polypropylene), PVA (polyvinyl alcohol), polyester such as PES (poly ether sulfone), PEEK (polyetheretherketone), PEI (polyetherimide), PEN (polyethylenenaphthalate), and PET (polyethyleneterephthalate), PI (polyimide), PSF (polysulfone), or fluoride resin.

The first buffer layer 220 is arranged on the substrate 210, and may be made of, but not limited to, PI (polyimide). In the present disclosure, since the first buffer layer 220 is an element for constituting a neutral plane, the first buffer layer 220 will be described in more detail in the bending area 3.

The inorganic layer 230 may be made of a material that includes an oxide and a nitride, and may be made of an inorganic material such as silicon nitride (SiNx), silicon oxide (SiOx), titanium oxide (TiOx), aluminum oxide (AlOx), Indium Gallium Oxide (IGO), Indium Zinc Oxide (IZO), and Indium Gallium Zinc Oxide (IGZO). The inorganic layer 230 may serve to prevent water from being permeated thereinto. The inorganic layer 230 may be directly on the first buffer layer 220 such that the first buffer layer 220 is directly under the inorganic layer 230.

The second buffer layer 240 is arranged above the substrate 210, and may be made of, but not limited to, PI (polyimide). In the present disclosure, since the second buffer layer 240 is an element for constituting a neutral plane, the second buffer layer 240 will be described in more detail in the bending area 3.

The multi-buffer layer 250 may be made of an inorganic material that includes an oxide and a nitride of a metal material such as silicon Si, aluminum Al, barium Ba, molybdenum Mo, copper Cu, titanium Ti, and Zinc Zn. The multi-buffer layer 250 serves to prevent a material contained in the substrate 210 from being diffused into the thin film transistor T during a high temperature process of manufacturing processes of the thin film transistor T. Also, the multi-buffer layer 250 may serve to prevent external water or humidity from being permeated into the transparent flexible display device. Thus, the multi-buffer layer 250 has a high resistance to water than other features of the transparent flexible display device such as the second buffer layer 240.

The thin film transistor T includes an active layer 110, a gate insulating film 120, a gate electrode 130, a dielectric inter-layer 140, a source electrode 150, and a drain electrode 160.

The active layer 110 is formed on the substrate 210 to overlap the gate electrode 130. The active layer 110 may be made of a silicon based semiconductor material or an oxide based semiconductor material. As it is shown in FIG. 7, a light shielding layer 284 and active buffer 290 may additionally be formed between the substrate 210 and the active layer 110. In this case, external light incident through a lower surface of the substrate 210 may be shielded by the light shielding layer 284, whereby the active layer 110 may be prevented from being damaged by the external light.

The gate insulating film 120 is formed on the active layer 110. The gate insulating film 120 serves to insulate the active layer 110 from the gate electrode 130. The gate insulating film 120 may be made of an inorganic insulating material, for example, may be made of, but not limited to, a silicon oxide film ($SiO_X$), a silicon nitride film ($SiN_X$), or a multi-layer of $SiO_X$ and $SiN_X$. The gate insulating film 120 may be extended to the non-display area 2.

The gate electrode 130 is formed on the gate insulating film 120. The gate electrode 130 is formed to overlap the active electrode 110 by interposing the gate insulating film 120 therebetween. The gate electrode 130 may be, but not limited to, a single layer or multi-layer comprised of any one of Mo, Al, Cr, Au, Ti, Ni, Nd and Cu or their alloy.

The dielectric inter-layer 140 is formed on the gate electrode 130. The dielectric inter-layer 140 may be formed of the same inorganic insulating material as that of the gate insulating film 120, for example, may be formed of, but not limited to, a silicon oxide film ($SiO_X$), a silicon nitride film ($SiN_X$), or a multi-layer of $SiO_X$ and $SiN_X$.

The source electrode 150 and the drain electrode 160 are formed on the dielectric inter-layer 140 to face each other. The aforementioned gate insulating film 120 and the aforementioned dielectric inter-layer 140 are provided with a first contact hole CH1 and a second contact hole CH2, wherein the first contact hole CH1 exposes one end area of the active layer 110, and the second contact hole CH2 exposes the other end area of the active layer 110. The source electrode 150 is connected with the other end area of the active layer 110 through the second contact hole CH2, and the drain electrode 160 is connected with the one end area of the active layer 110 through the first contact hole CH1. Also, the source electrode 150 may be extended to the non-display area 2 and then connected with a first link line 151.

The aforementioned thin film transistor layer T may be modified to various structures known to those skilled in the art without limitation to the above structure as shown. For example, although the thin film transistor T is formed in a top gate structure in the drawing in which the gate electrode 130 is formed above the active layer 110, the thin film transistor T may be formed in a bottom gate structure in which the gate electrode 130 is formed below the active layer 110.

The passivation layer 270 is formed on the thin film transistor layer T, more specifically on the source electrode 150 and the drain electrode 160. The passivation layer 270 serves to protect the thin film transistor layer T, and may be made of, but not limited to, an inorganic insulating material, for example, $SiO_X$ or $SiN_X$.

The planarization layer 180 is formed on the passivation layer 270. The planarization layer 180 serves to planarize the upper portion of the substrate 210 provided with the thin film transistor layer T. The planarization layer 180 may be made of, but not limited to, an organic insulating material such as acrylic resin, epoxy resin, phenolic resin, polyamide resin, and polyimide resin.

The anode electrode 185 is formed on the planarization layer 180. The aforementioned passivation layer 270 and the aforementioned planarization layer 180 are provided with a third contact hole CH3 that exposes the source electrode 150, and the source electrode 150 and the anode electrode 185 are connected with each other through the third contact hole CH3.

The auxiliary electrode 190 is formed on the same layer as that of the anode electrode 185. The auxiliary electrode 190 serves to reduce resistance of the cathode electrode 207 which will be described later.

The bank layer 200 is formed at one surface of the planarization layer 180 and over both edges of the anode electrode 185 and both edges of the auxiliary electrode 190. The planarization layer 180 includes the third contact hole CH3 that exposes the source electrode 150 from the passivation layer 270 and the planarization layer 180. The bank layer 200 may prevent water from being permeated into the transparent flexible display device. The bank layer 200 may be made of, but not limited to, an organic insulating material such as polyimide resin, acrylic resin, and BCB.

Although not shown, the organic light emitting layer 203 may be formed in a structure that a hole injecting layer, a hole transporting layer, an organic light emitting layer, an electron transporting layer and an electron injecting layer are sequentially deposited. In this case, one or two or more of the hole injecting layer, the hole transporting layer, the electron transporting layer and the electron injecting layer may be omitted. The organic light emitting layer may be formed to emit same colored light, for example, white color for each pixel, or may be formed to emit different colored light, for example, red, green and blue light different for each pixel.

The cathode electrode 207 is formed on the organic light emitting layer 203. Since the cathode electrode 207 is formed on a surface where light is emitted, the cathode electrode 207 is made of a transparent conductive material. Since the cathode electrode 207 is made of a transparent conductive material, it has high resistance. Therefore, to reduce resistance of the cathode electrode 207, the cathode electrode 207 is connected with the auxiliary electrode 190. The cathode electrode 207 may be formed through a deposition process, such as sputtering, which does not have good linearity of a deposition material.

Although not shown, an encapsulation layer may additionally be formed on the cathode electrode 207 to prevent water permeation from occurring. Various materials known in the art may be used as the encapsulation layer. Also, although not shown, a color filter for each pixel may additionally be formed on the cathode electrode 207. In this case, the organic light emitting layer 203 may emit white light.

Next, in the GIP area 4, respective layers are formed to correspond to the display area 1, and a plurality of driving devices and power lines are formed on the gate insulating film 120. Also, the inorganic layer 230 in the GIP area 4 may be provided with a light shielding layer 282 formed on the same layer as that of a bending connection line 280 by the same process as that of the bending connection line 280 which will be described later. However, without limitation to this example, the light shielding layer 282 may be formed in any one area of the display area 1, the non-display area 2 and the GIP area 4.

Next, the driving film 5 is arranged in parallel with the non-display area 2 and transfers an electrical signal for displaying an image to the display area. The driving film 5 is connected with a second link line 153 which will be described later. That is, a circuit pad (not shown) may be formed at one end of the driving film 5 to be connected with an external system (not shown), whereby the display area 1 is electrically connected with the external system.

Next, the non-display area 2 and the bending area 3 of the flexible display device according to the present disclosure will be described in more detail. Repeated description of the display area 1 will be omitted.

The non-display area 2 and the bending area 3 of the flexible display device according to the present disclosure additionally include a fourth contact hole CH4, a fifth contact hole CH5, a bending connection line 280, a first link line 151, and a second link line 153. Also, the inorganic layer 230 in the non-display area 2 may be provided with a light shielding layer formed on the same layer as that of the bending connection line 280 by the same process as that of the bending connection line 280.

The source electrode 150 of the display area is extended to the first link line 151, whereby the first link line 151 is electrically connected with one end (e.g., a first end) of the bending connection line 280 of the bending area through the fourth contact hole CH4. The other end (e.g., a second end) of the bending connection line 280 is connected with the second link line 153, which is connected with a pad portion, through the fifth contact hole CH5. Also, the link line 151 and the second link line 153 may be arranged in parallel with each other while the flexible display device is bent in the bending area as shown in FIG. 9.

The inorganic layer 230 may include a first inorganic layer and a second inorganic layer. The bending connection line 280 may be formed on the first inorganic layer at the bending area. And then, the second inorganic layer may be formed on the first inorganic layer and the bending connection line 280. Therefore, the bending connection line 280 is arranged to be surrounded by the inorganic layer 230.

Also, the inorganic layer 230 is disposed between the first buffer layer 220 and the second buffer layer 240 such that the first buffer layer 220 is directly under the inorganic layer 230 and the second buffer layer 240 is directly on the inorganic layer 230.

The first buffer layer 220 and the second buffer layer 240 may be formed of a same material such as polyimide at the same thickness by interposing the inorganic layer 230 there between. However, the first buffer layer 220 and the second buffer layer 240 may be made of cellulose resin such as TAC (triacetyl cellulose) or DAC (diacetyl cellulose), COP (cyclo olefin polymer) such as Norbornene derivatives, COC (cyclo olefin copolymer), acrylic resin such as PMMA (poly(methylmethacrylate), polyolefin such as PC (polycarbonate), PE (polyethylene) or PP (polypropylene), PVA (polyvinyl alcohol), PES (poly ether sulfone), PEEK (polyetheretherketone), PEI (polyetherimide), PEN (polyethylenenaphthalate), and PET (polyethyleneterephthalate), etc. without limitation to polyimide.

As described above, the bending connection line 280 to which the first and second link lines 151 and 153 are connected is arranged between the first and second buffer layers 220 and 240 unlike the conventional flexible display device, whereby the high resolution flexible display device having a linear line structure can be obtained.

Since the bending connection line 280 is arranged between the first buffer layer 220 and the second buffer layer 240, a neutral plane is formed on the bending connection line 280. The neutral plane means a plane that is only to be bent with maintaining its original length without being increased or reduced when a bending moment is applied thereto. That is, the neutral plane means a plane that a minimum force is applied to a bending surface by counterbalancing of a tensile stress and a compressive stress applied to the bending connection line during bending.

Also, the neutral plane NP occurring when a bending moment is applied to an object is formed in the middle of the object. Therefore, if upper and lower portions arranged by interposing a line there between have the same thickness and the same property as each other if possible, the line to be protected by the neutral plane NP occurring when bending moment is applied to the flexible display device is formed.

Hereinafter, the neutral plane formed in the first and second buffer layers 220 and 240 and the bending connection line 280 of the flexible display device according to the present disclosure will be described with reference to FIG. 8.

Figure 8:
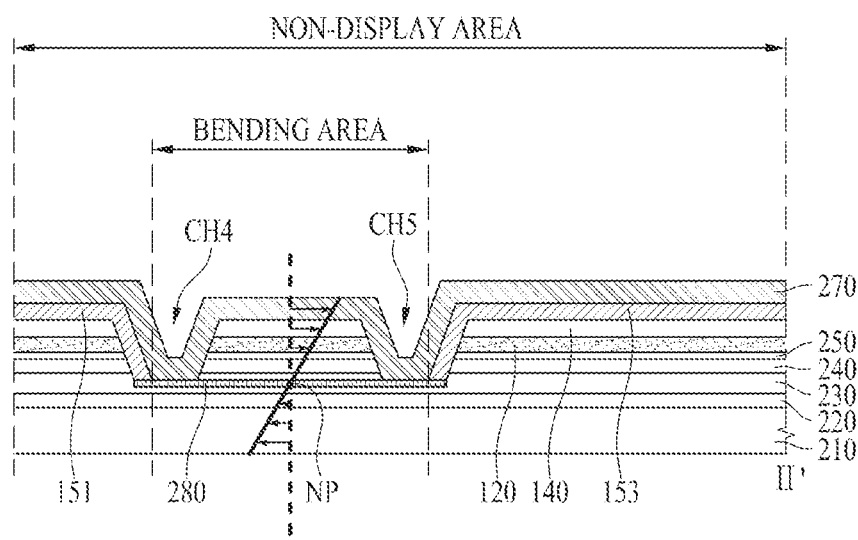
FIG. 8 is a view illustrating a neutral plane of a flexible display device according to the present disclosure.

FIG. 8 is a view illustrating a neutral plane formed in a bending area of a flexible display device according to the present disclosure. The neutral plane NP is formed at the center of the bending connection line 280 shown in FIG. 8. At this time, a force in an arrow direction is transferred from a dotted line shown in a vertical direction to a straight line tangent to the dotted line in a diagonal direction. In this case, upper arrows based on the neutral plane NP represent a tensile stress, and lower arrows based on the neutral plane NP represent a compressive stress. If this tensile stress and the compressive stress are applied repeatedly or at a breaking strength or more, the line formed in the flexible display device may be damaged or shorted.

In this respect, in the flexible display device according to the present disclosure, to minimize a bezel and prevent the bending connection line 280 disposed in the bending area 3 from being damaged, a thickness of each layer on the bending area 3 may be determined such that the neutral plane may be disposed on the bending connection line 280.

Figure 9A:
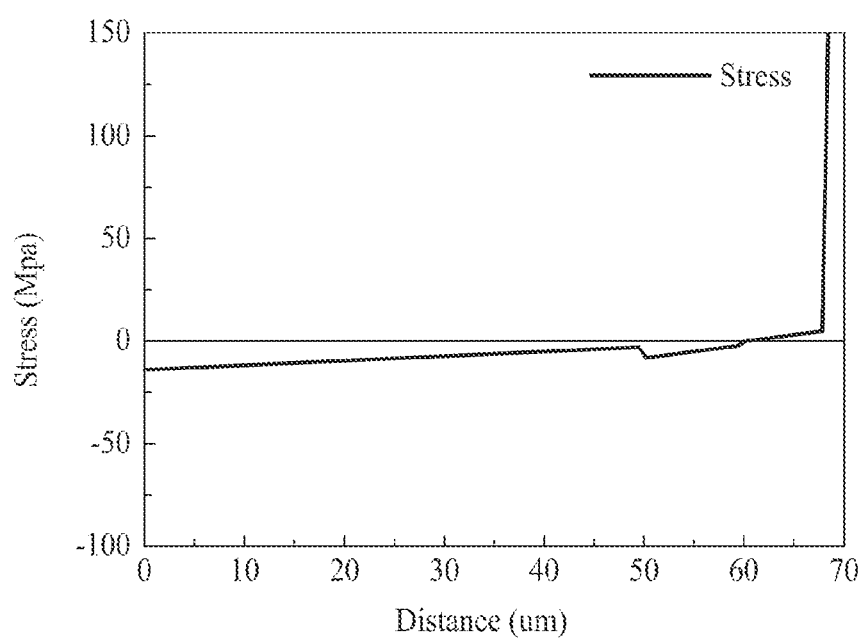
FIGS. 9A to 9C are views illustrating an experiment for determining a thickness of a flexible display device according to the present disclosure.
Figure 9B:
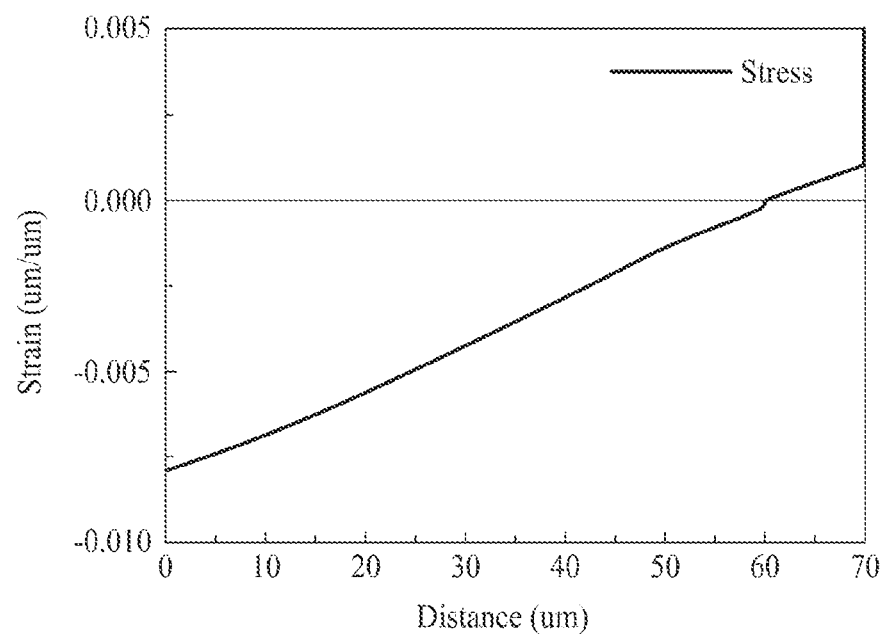
Figure 9C:
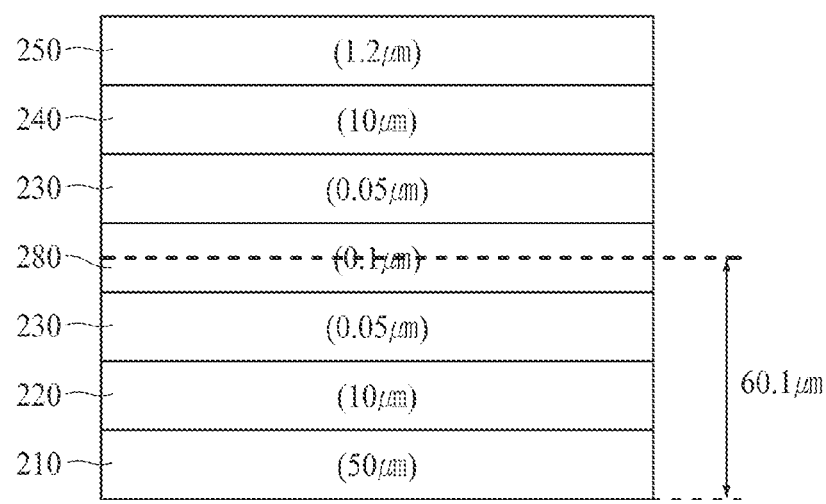

FIGS. 9A and 9B illustrate experiments for determining thicknesses of a substrate and buffer layers of a flexible display device according to the present disclosure. FIG. 9C illustrates that a thickness of each layer of the flexible display device according to the present invention is set based on the above experiments.

Axes X of graphs in FIGS. 9A and 9B mean a distance where the neutral plane occurs, and axes Y represent stress and strain, respectively. An analysis method through such simulations shown in FIGS. 9A and 9B is based on a neutral plane's theory about Young's Modulus (E), Poisson's ratio (v), thickness (d), Strain (ε) and Layer Total Thickness (h).

Referring to FIGS. 9A and 9B, when a total thickness to reach the bending connection line 280 including the thickness of the substrate is 60.1 µm or 60.2 µm, the neutral plane may be formed on the bending connection line 280. That is, if a line is arranged at a point where a total thickness to reach the bending connection line 280 including the substrate is 60.1 µm or 60.2 µm, to protect the point, minimum strain acts on the point. Therefore, the bending connection line 280 is arranged using the point as a target point.

Referring to FIG. 9C, when the thickness of the substrate 210 is designed at 50 µm, the thickness of the first buffer layer 220 at 10 µm, the thickness of the inorganic layer 230 at 0.1 µm, the thickness of the second buffer layer 240 at 10 µm and the thickness of the multi-buffer layer 250 at 1.2 µm, and the bending connection line 280 is arranged on the inorganic layer 230, the neutral plane may be formed on the bending connection line 280. That is, when the thickness of each layer of the flexible display device according to the present disclosure is as shown in FIG. 9C, the neutral plane is formed on the bending connection line 280, whereby the bending connection line 280 is neither damaged nor shorted even in case of bending. However, the above thickness is only exemplary, and a position of the neutral plane may be varied depending on thickness or property of the substrate and thickness or property of the first and second buffer layers 220 and 240. Therefore, a desired neutral plane may be designed using a thickness value that may be designed easily by the person with ordinary skill in the art. For example, the first and second buffer layers 220 and 240 may be designed to have the same thickness and the same property as each other.

Also, an island pattern is formed in the bending area 3 through etching as shown in FIG. 8. This pattern structure may reduce a concentration level of stress as compared with an inorganic single layered structure, whereby occurrence of a crack may be reduced. Although one island pattern structure is shown, the island pattern structure is not limited to the shown structure. For example, a plurality of island patterns may be formed through etching.

Figure 10:
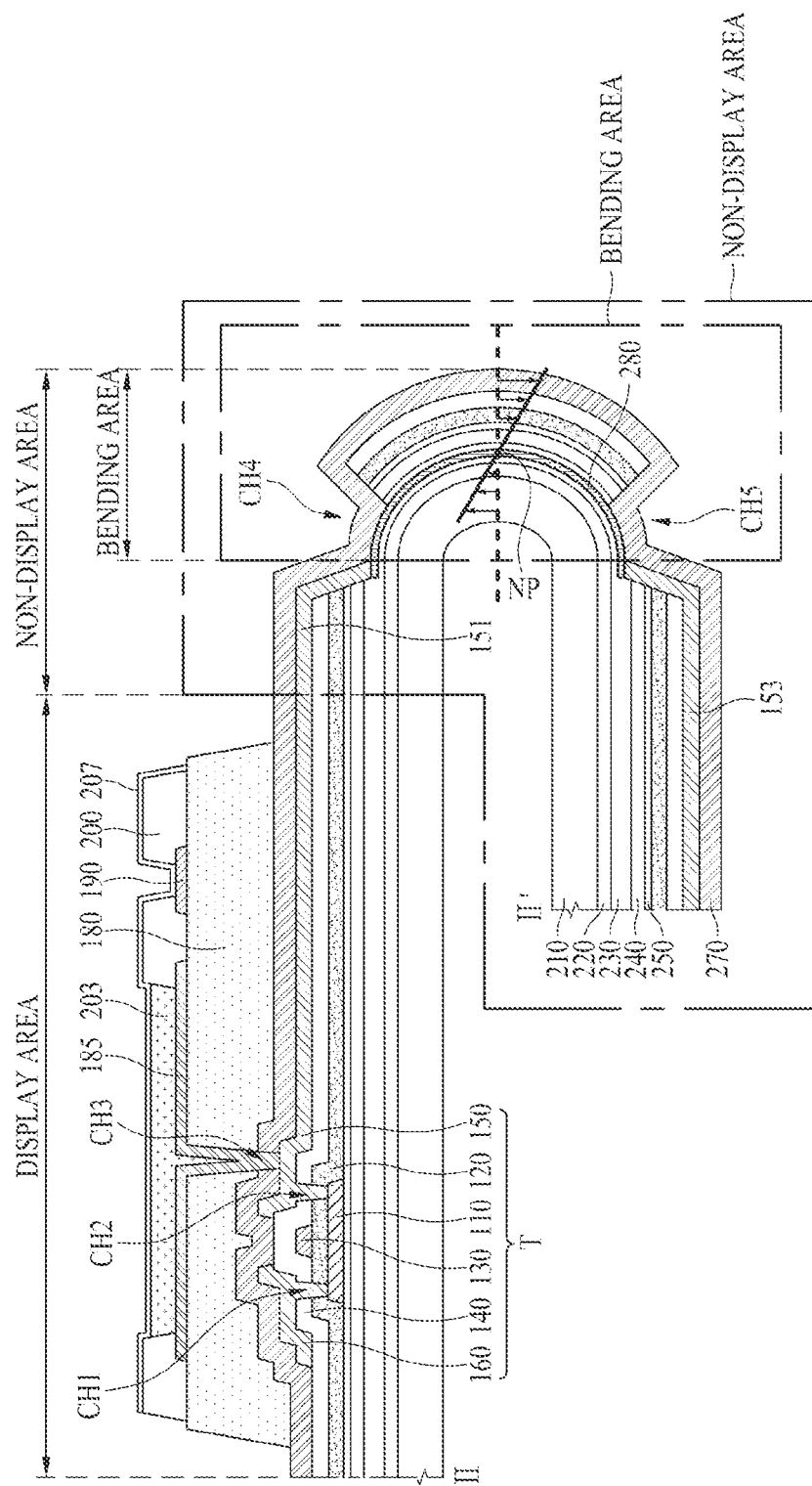
FIG. 10 is a cross-sectional view illustrating that a flexible display device according to the present disclosure is bent.

FIG. 10 is a cross-sectional view illustrating that a bending area of a flexible display device according to the present disclosure is bent.

As will be aware of it from FIG. 10, the neutral plane where a compressive stress and a tensile stress are counterbalanced is formed on the bending connection line 280 in the bending area 3, whereby the bending connection line 280 is neither damaged nor shorted. Also, the bending connection line 280 of the flexible display device according to the present disclosure may be used for the high resolution flexible display device in which spacing between lines is reduced, by forming a straight line structure. Also, since the bezel of the flexible display device corresponding to the non-display area 2 may become thin due to bending of the bending area 3, the flexible display device of which esthetic appearance is improved may be obtained.

As described above, according to the present disclosure, the following advantages can be obtained.

First of all, the flexible display device that can prevent a crack from occurring in the lines of the bending area can be obtained.

Secondly, the flexible display device of high resolution can be obtained by using the straight line.

Finally, the flexible display device of which esthetic appearance is improved can be obtained by minimizing the bezel of the non-display area.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
    a substrate including an active area and a non-display area, the non-display area including a bending area configured to be bent;
    a link line including a first link line and a second link line in the non-display area; and
    a bending connection line including a first end connected to the first link line and a second end connected to the second link line, the bending connection line electrically connected with the first link line and the second link line on the substrate,
    wherein the bending connection line is on a different layer from the link line,
    wherein the bending connection line is not separated in the bending area.

2. The display device of claim 1, wherein the first link line is connected to the first end of the bending connection line via a first contact hole, and the second link line is connected to the second end of the bending connection line via a second contact hole.

3. The display device of claim 2, wherein the first contact hole and the second contact hole are in the non-display area.

4. The display device of claim 1, further comprising:
a driving film connected to the second link line, the driving film arranged in parallel with the substrate.

5. The display device of claim 1, wherein the bending connection line does not extend into the active area of the substrate.

6. The display device of claim 1, wherein the first link line and the second link line are on a same layer in the non-display area.

7. The display device of claim 1, wherein the bending connection line has a straight line structure.

8. The display device of claim 1, wherein the substrate further includes a gate-in-panel area, the display device further comprising:
a gate driving circuit in the gate-in-panel area; and
a light shielding layer in the gate-in-panel area,
wherein the bending connection line is on a same layer as the light shielding layer.

9. The display device of claim 1, wherein a thickness of the bending connection line is constant in the non-display area.

10. The display device of claim 1, further comprising:
a thin-film-transistor (TFT) in the active area, the TFT including an active layer, a gate electrode, a source electrode, and a drain electrode,
wherein the bending connection line is closer to the substrate than the thin-film-transistor in a vertical direction.

11. A display device comprising:
a substrate including a display area, a non-display area, and a gate-in-panel area;
a link line including a first link line and a second link line in the non-display area; and
a connection line including a first end connected to the first link line and a second end connected to the second link line, the connection line electrically connected with the first link line and the second link line on the substrate,
wherein the gate-in-panel area includes a light shielding layer,
wherein the connection line is on a different layer from the link line,
wherein the connection line is on a same layer as the light shielding layer.

12. The display device of claim 11, wherein the non-display area includes a bending area configured to be bent and the connection line is in the bending area.

13. The display device of claim 12, the connection line is not separated in the bending area.

14. The display device of claim 11, wherein the first link line is connected to the first end of the connection line via a first contact hole, and the second link line is connected to the second end of the connection line via a second contact hole.

15. The display device of claim 14, wherein the first contact hole and the second contact hole are in the non-display area.

16. The display device of claim 11, further comprising:
a driving film connected to the second link line, the driving film arranged in parallel with the substrate.

* * * * *